(12) United States Patent
Takenouchi et al.

(10) Patent No.: US 6,284,376 B1
(45) Date of Patent: Sep. 4, 2001

(54) ORNAMENTAL ARTICLE AND PROCESS FOR PRODUCING THE SAME

(75) Inventors: Kazunori Takenouchi; Mitsuhiko Koshida, both of Kokubu; Kouichi Kijima; Shinichi Hayashi, both of Sendai, all of (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/222,206

(22) Filed: Dec. 29, 1998

(51) Int. Cl.$^7$ .......................................................... B32B 7/02
(52) U.S. Cl. ........................... 428/408; 428/216; 428/336; 428/325; 428/698
(58) Field of Search .................................. 428/408, 697, 428/698, 699, 336, 216, 325

(56) References Cited

U.S. PATENT DOCUMENTS 5,225,275 * 7/1993 Aida ...................................... 428/698
5,705,271 * 1/1998 Okamura et al. ..................... 428/408
5,981,060 * 11/1999 Koshida et al. ...................... 428/408

FOREIGN PATENT DOCUMENTS

| 62-180071 | 8/1987 | (JP) . |
|---|---|---|
| 1244705 | 9/1989 | (JP) . |
| 1265841 | 10/1989 | (JP) . |
| 0808921 | 11/1997 | (JP) . |

\* cited by examiner

*Primary Examiner*—Archene Turner
(74) *Attorney, Agent, or Firm*—Hogan & Hartson, LLP

(57) ABSTRACT

An ornamental article comprises a base at least a surface portion of which comprises a transition metal selected from Group 4*a*, 5*a* and 6*a* elements in the periodic table or its alloy; a hard carbon film covering a surface of the base; and an intermediate layer interposed between the base and the hard carbon film and containing a carbide of the transition metal. The hard carbon film has a high adhesion strength to its base, and is superior in corrosion resistance and abrasion resistance.

9 Claims, 3 Drawing Sheets

ORNAMENTAL ARTICLE AND PROCESS FOR PRODUCING THE SAME

FIELD OF THE INVENTION

The present invention relates to an ornamental article coated with a hard carbon film and a process for producing the same and, more particularly, to an improvement in ornamental articles such as watch cases, watch bands, necklaces, pierced earrings, eyeglass frames, fishing line guides, cigarette lighters, rings, buttons and brooches, and the like.

BACKGROUND OF THE INVENTION

Ornamental articles are typically made of natural minerals (metals) and metal alloys. From the viewpoint of allergy prevention and weight reduction, Ti (which is a transition metal) and its alloys (e.g., Ti—Al—V) are employed for production of the ornamental articles.

However, ornamental articles made of metal materials are generally liable to corrode when wetted with sweat in direct contact with human skin or when exposed to salt water or rain and, therefore, have a poor corrosion resistance. Further, the ornamental articles are liable to be scratched, cracked or chipped by external shocks, as they are used in daily life.

Recently, there have been developed color ceramics such as zirconia and alumina which are superior in corrosion resistance and scratch resistance, and golden and silvery sintered alloys such as cermet alloys and superhard alloys which are obtained by sintering a carbide or a nitride (e.g., WC, TiC, TiN) along with an alloy of iron group metals (e.g., Ni, Co).

The aforesaid color ceramics and sintered alloys exhibit their unique single colors, providing poor aesthetic effects. For improvement of the aesthetic effects, the ornamental articles are subjected to a partial coating process or to a combination process for a satin finish and a mirror finish. However, the aesthetic effects are still unsatisfactory. In addition, these processes increase the production cost.

For surface protection, there has been proposed formation of a hard carbon film such as of diamond on the surface of a base composed of a metal material such as gold or an alloy thereof (Japanese Unexamined Patent Publications No. 62-180071 (1987) and No. 1-244705 (1989)). Further, coating of various non-metal bases with diamond (which is the most chemically stable substance) has been proposed for enhancement of abrasion resistance. The diamond film can be formed on a surface of any of the various bases by a thermal CVD method, a microwave CVD method, a plasma CVD method or the like.

Where a diamond film is formed on a metal base, however, the diamond film has a poor adhesion to the metal base, so that the diamond film is liable to be separated from the base due to thermal expansion or the like during a prolonged use. To overcome this problem, it has been proposed that an intermediate layer such as of silicon carbide is formed on the base and then a diamond film is formed on the intermediate layer. However, the adhesion of the film is still unsatisfactory.

The diamond film disclosed in the aforesaid publications is formed by the plasma CVD method or the like. The resulting diamond film has a high purity diamond structure with $SP^3$-hybridized carbon atoms. The high purity diamond film has crystal grains of great sizes (not less than several micrometers) because of remarkable diamond crystal growth. Therefore, diamond filming is difficult unless diamond is allowed to grow to a greater thickness.

In addition, the diamond film has a rough surface (Rmax>1 $\mu$m) and many voids because of its great crystal grain sizes, so that irregular reflection occurs on the surface. Therefore, an ornamental article formed with such a diamond film is less lustrous. Although the irregular reflection due to the surface roughness may be eliminated by polishing the film surface, a polishing process for mirror-finishing the surface of the diamond film requires quite a long time, resulting in a lower productivity.

As described above, the diamond film having great crystal grain diameters exhibits a reduced adhesion to the base, and includes great defects therein. Accordingly, there is a possibility that the diamond film is partially chipped due to collision or impact.

Where a diamond film is formed on a base composed of a ceramic or a sintered alloy, irregular reflection on the surface of the diamond film deteriorates the aesthetic effects as in the aforesaid case.

Since the diamond film has many voids therein, a metal component in the base leaches out of an ornamental article when the article is exposed to sweat, salt water or the like over an extended period. This may cause allergy symptom such as an inflammation in human skin in contact with the article.

SUMMARY OF THE INVENTION

It is a primary object of the present invention to provide an ornamental article which includes a hard carbon film such as a diamond film formed on a base thereof with an enhanced adhesion therebetween, and has an improved scratch resistance, abrasion resistance and corrosion resistance.

It is another object of the present invention to provide an ornamental article which has a superior aesthetic effect.

It is further another object of the present invention to provide an ornamental article which has a tight and hard carbon film formed on a base thereof for prevention of leach-out of an allergenic component from the base.

It is still another object of the present invention to provide an ornamental article having a hard carbon film which obviates or reduces the need for surface-finishing thereof for reduction of the production cost.

In accordance with one aspect of the present invention, there is provided an ornamental article which comprises: a base at least a surface portion of which is composed of a transition metal selected from Group 4a, 5a and 6a elements in the periodic table or an alloy containing the transition metal as its principal component; a hard carbon film covering the surface of the base; and an intermediate layer interposed between the base and the hard carbon film and containing a carbide of the transition metal.

Since the intermediate layer which contains the carbide of the same transition metal as that contained in the base is interposed between the metal base and the hard carbon film, the adhesion strength of the hard carbon film to the base can be enhanced and, in addition, the scratch resistance, abrasion resistance and corrosion resistance can be improved.

It is particularly preferred that the intermediate layer is composed of a composite material containing the carbide of the transition metal and at least one selected from silicon carbide and hard carbon.

The hard carbon film preferably has peaks in wavelength ranges of 1160±40 $cm^{-1}$, 1340±40 $cm^{-1}$ and 1500±60 $cm^{-1}$ as determined by the Raman spectroscopy with intensities $H_1$, $H_2$ and $H_3$ of the highest peaks within the respective wavelength ranges satisfying the following expressions (1) and (2):

$$0.02 \leq H_1/H_2 \quad (1)$$

$$H_2 < H_3 \quad (2)$$

wherein $H_1$, $H_2$ and $H_3$ are peak heights as measured from a base line (B.L.) extending between points of the lowest intensities which are respectively present in smaller- and greater-wavelength regions outside the wavelength ranges.

Since the hard carbon film is thus composed of minute crystal grains, the hard carbon film is tight. Further, the hard carbon film has a smooth surface because of the minute crystal grains.

In accordance with another aspect of the present invention, there is provided an ornamental article which comprises a base and a hard carbon film covering a surface of the base, wherein the hard carbon film has peaks in wavelength ranges of $1500\pm60$ cm$^{-1}$, $1160\pm40$ cm$^{-1}$ and $1340\pm40$ cm$^{-1}$ as determined by the Raman spectroscopy, and has a density of not less than 3.1 g/cm$^3$ and a thickness of 0.15 to 2.0 µm.

Since the hard carbon film has a densified structure with minute crystal grains and has a thickness of 0.15 to 2.0 µm, the ornamental article has a surface which exhibits a color of the base while glittering with an iridescent hue of seven colors.

The foregoing and other objects and advantageous features of the present invention will become apparent from the following detailed description.

DETAILED DESCRIPTION OF THE INVENTION

Figure 1:
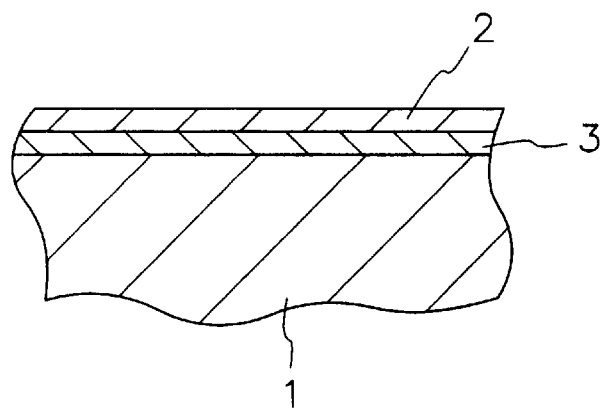
FIG. 1 is an enlarged sectional view illustrating part of an ornamental article according to one embodiment of the present invention.

One embodiment of the present invention is shown in FIG. 1, which illustrates a section of a surface portion of an ornamental article according to this embodiment. As shown in FIG. 1, a hard carbon film 2 which is superior in corrosion resistance and abrasion resistance is formed over a surface of a base 1 with an intermediate layer 3 interposed therebetween.

At least a surface portion of the base 1 is composed of a transition metal selected from Group 4a, 5a and 6a elements in the periodic table or an alloy containing the transition metal as its principal component. More specifically, the base 1 is entirely composed of the transition metal or its alloy, or only the surface portion of the base 1 is composed of the transition metal or its alloy with the other portion thereof being composed of any other metal or material.

Examples of the transition metal include Ti, V, Cr, Zr, Nb, Mo, Hf, Ta and W, which may be used either alone or in combination.

The intermediate layer 3 contains the same transition metal as that contained either alone or as its alloy in at least the surface portion of the base 1. Where Ti or a Ti alloy is employed for the base 1, for example, the intermediate layer 3 may be composed of a material containing TiC. A preferred material for the intermediate layer 3 is a composite material containing the carbide of the same transition metal as that contained in the base 1 and silicon carbide (SiC) and/or hard carbon.

The intermediate layer 3 interposed between the base 1 and the hard carbon film 2 improves the adhesion of the hard carbon film 2 to the base 1. This is supposedly based on the following ground.

In general, atoms are bonded to each other via electrons. A covalent bond formed by sharing valence electrons by two atoms provides a stronger bonding force than an ionic bond. Particularly, the bonding force between carbon atoms in the hard carbon film such as a diamond film is strong because the carbon atoms are covalently bonded. For enhancement of the adhesion strength of the hard carbon film to a different compound, it is preferred to interpose therebetween a covalent compound which has a similar bonding configuration to the hard carbon film. Further, it is preferred in terms of the compatibility with the hard carbon film to employ a compound containing carbon atoms which are a diamond constituent element.

For this reason, the use of a covalent metal carbide as the material for the intermediate layer 3 enhances the adhesion of the hard carbon film 2. A carbide of a transition metal (e.g., Ti) selected from Group 4a, 5a and 6a elements in the periodic table has strong covalent bonds. Particularly where the transition metal carbide is of a cubic crystal system and has a lattice constant close to that of diamond, the adhesion strength of the hard carbon film 2 can further be enhanced.

Conversely, where carbides of Group 1, 2 and 3 elements in the periodic table which have strong ionic bonds are employed, the adhesive strength cannot be enhanced.

Where the base 1 is composed of a material containing a transition metal selected from Group 4a, 5a and 6a elements as its principle component and the intermediate layer 3 is composed of a material containing a carbide of the same transition metal as that contained in the base 1 (i.e., the same transition metal is contained in the base 1 and the intermediate layer 3) the adhesion of the intermediate layer 3 to the base 1 can be enhanced. Since the carbide of the transition metal of Group 4a, 5a or 6a enhances the adhesion of the hard carbon film 2 as described above, the adhesion of the hard carbon film 2 to the base 1 can be improved.

The hard carbon film 2 and the intermediate layer 3 are illustrated as independent layers in FIG. 1 for convenience. Actually, these layers are not compositionally distinct layers, but are configured such that hard carbon grains of the hard carbon film 2 are insularly interspersed as being surrounded by the metal carbide. As a result, the adhesion of the hard carbon film 2 is improved by a so-called anchoring effect.

The adhesion can further be enhanced by employing as the material for the intermediate layer 3 a composite material containing the same hard carbon component as that contained in the hard carbon film 2 and/or silicon carbide (SiC) having strong covalent bonds in addition to the transition metal carbide.

The intermediate layer 3 is preferably of a double-layer structure including a first layer composed of a composite material containing the transition metal carbide and hard carbon and a second layer composed of a composite material containing silicon carbide and hard carbon. The first and second layers are formed on the surface of the base in this order.

In this case, the first and second layers are not compositionally distinct layers, but are so-called gradient layers intermingled with each other. More specifically, a portion of the first layer adjacent to the base 1 contains a greater amount of the carbide of the same transition metal as that contained in the base 1, and the second layer contains a progressively increasing amount of silicon carbide toward the hard carbon film 2. Thus, the adhesion can be enhanced.

The hard carbon film 2 has peaks in wavelength ranges of 1160±40 cm$^{-1}$, 1340±40 cm$^{-1}$ and 1500±60 cm$^{-1}$ as determined by the Raman spectroscopy with intensities $H_1$, $H_2$ and $H_3$ of the highest peaks within the respective wavelength ranges satisfying the expressions (1) and (2) described above (see FIG. 2).

The peak at 1160±40 cm$^{-1}$ represents a diamond precursor (or a polyene structure) which is a fine crystalline phase. The peak at 1340±40 cm$^{-1}$ represents diamond crystals, while the peak at 1500±60 cm$^{-1}$ represents an amorphous carbon phase.

If the peak intensity ratio ($H_1/H_2$) in the expression (1) is less than 0.02, the hard carbon film includes diamond crystals having excessively large grain sizes and, therefore, has defects therein and a greater surface roughness. This may promote local corrosion in the base. On the other hand, if the peak intensity ratio is too great, the proportion of the diamond crystals is reduced, resulting in a lower film strength. Therefore, the peak intensity ratio $H_1/H_2$ is preferably not greater than 1.0.

It is also important that the hard carbon film 2 also has a peak in the wavelength range of 1500±60 cm$^{-1}$ and the highest peak intensity $H_3$ in this range satisfies $H_1<H_2<H_3$.

The peak at 1500±60cm$^{-1}$ represents the amorphous carbon phase which is present in interspace between the diamond crystals. Since fine amorphous carbon grains are filled in the interspace between the diamond crystals in the hard carbon film 2, the hard carbon film 2 has a high density and is tight. Therefore, the thickness of the hard carbon film 2 can be reduced and yet is capable of preventing the leach-out of the metal component from the base 1.

Figure 3:
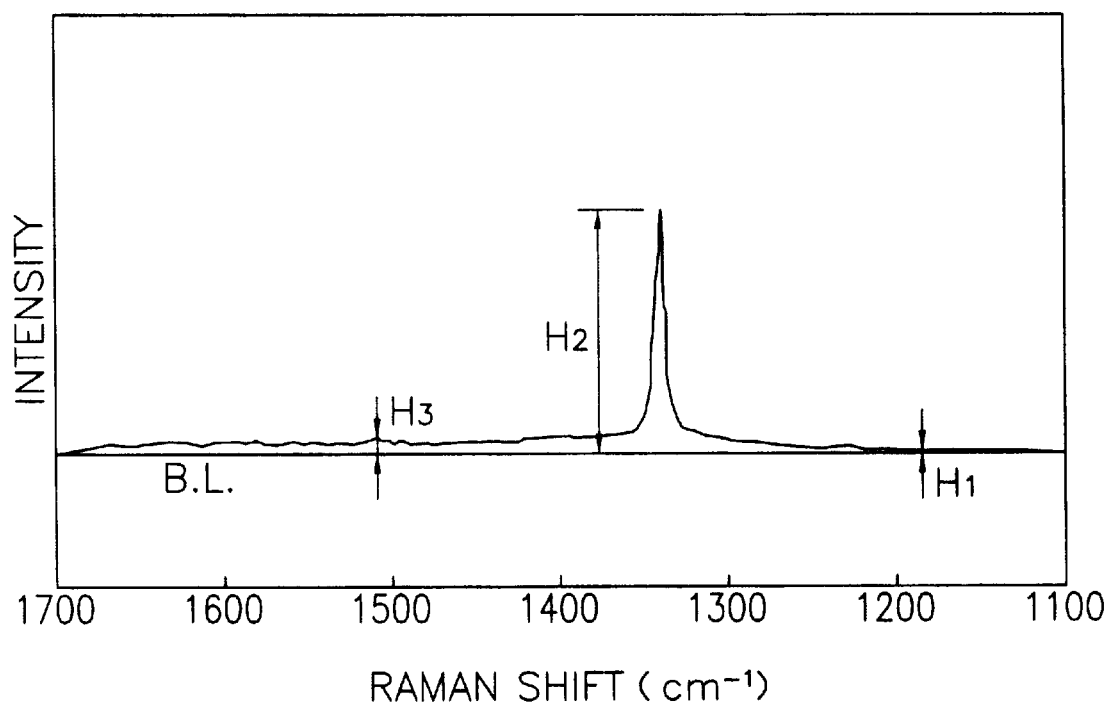
FIG. 3 shows a Raman spectrum chart for a hard carbon film for comparison.

By the way, a hard carbon film having a spectrum chart as shown in FIG. 3 has a $H_1/H_2$ of less than 0.02 and does not satisfy the relation $H_1<H_2<H_3$. This may promote local corrosion in the base, and the metal component may be leached from the base.

As described above, the hard carbon film 2 is a tight film which is composed of the fine diamond precursor (carbon in a polyene form), the diamond crystals and the amorphous carbon phase, and has a density of not less than 3.1 g/cm$^3$ because of such a composition. If the density is less than 3.1 g/cm$^3$, the hard carbon film 2 has a smaller amount of the diamond crystals or includes defects therein. Accordingly, there is a possibility that the hard carbon film 2 has a lower hardness and cannot prevent the leach-out of the metal component.

The diamond crystals in the hard carbon film 2 are very fine. These fine crystals exist in the amorphous carbon phase to form the tight film which is almost free of voids. The fine crystals preferably have an average grain diameter of not greater than 1 μm, typically not greater than 80 nm, as measured by means of a transmission electron microscope (TEM). If the average particle diameter of the crystals is greater than the aforesaid range, the hard carbon film 2 does not have a smooth surface because of rough surfaces of the crystals.

Since the hard carbon film 2 per se has a high hardness and is composed of the very tight and fine crystals with fewer defects therein, the hard carbon film 2 imparts the ornamental article with scratch resistance. In addition, the hard carbon film 2 can be formed as having a smaller and uniform thickness. Further, the hard carbon film 2 has a smooth surface. This reduces the time required for the surface polishing process or obviates the need for the surface polishing process.

The tight and hard carbon film 2, even if brought into contact with sweat or salt water, is free from spot corrosion of the base 1 which may otherwise caused by the sweat and the like penetrating through the defects and grain boundaries in the film, and prevents the allergenic metal component from leaching out of the base 1.

The hard carbon film 2 is conformable with any configuration of the surface of the base 1 to form a smooth and tight film surface. Therefore, the ornamental article which is superior in corrosion resistance can be produced with a highly smooth surface.

Since the hard carbon film 2 is tight, the thickness thereof can be reduced. The hard carbon film 2 preferably has a thickness of about 0.1 to about 10 μm. If the thickness is less than 0.1 μm, the strength of the film is reduced. If the thickness is greater than 10 μm, the filming process requires a longer time, resulting in a cost increase.

In the present invention, the total thickness of the hard carbon film 2 and the intermediate layer 3 is typically 0.15 to 2 μm, preferably 0.3 to 1 μm. Thus, natural light incident to the hard carbon film 2 reaches the surface of the base 1, and the incident light and reflected light interfere with each other to cause the ornamental article to glitter with an iridescent hue. Since the thickness is thus reduced, a hue unique to the base 1 can externally be observed. The hue of the base and the light interference further improve the aesthetic effects of the ornamental article.

If the thickness of the hard carbon film 2 is greater than 2 μm, the light interference does not sufficiently occur. If the thickness of the hard carbon film 2 is less than 0.15 μm, the film is not tight. The base 1 preferably has a reflectivity of at least 50% or greater with respect to the natural light.

In general, the composition of the hard carbon film 2 relates to the density thereof. The principal component of the hard carbon film is confirmed to be crystalline by measuring the density thereof by a sink-float method and X-ray fluorimetry.

The density of the diamond crystals is 3.52 g/cm$^3$, while the density of the diamond precursor phase (carbon in a polyene form) and the amorphous carbon phase is not greater than 1.8 g/cm$^3$. Therefore, if the density of the hard carbon film 2 is not less than 3.1 g/cm$^3$ the diamond crystals are present in a proportion of not less than 76% in the film. Further, if the density is 3.3 to 3.4 g/cm$^3$, the diamond crystals are present in a proportion of 89 to 93% or greater in the film.

The hard carbon film 2 does not have a rough surface which is attributable to diamond crystals of a relatively great grain size, but has a highly smooth surface. Therefore, the need for the surface polishing process is obviated and, if a mirror finishing process is needed, the process can readily be performed within a shorter time. The hard carbon film 2 preferably has a surface roughness Ra of not greater than 0.05 μm and a hardness Hv of not less than 8000 kgf/mm$^2$.

It is noted that, if the film was comprised of the amorphous carbon phase alone, the film would have a smooth surface but have a hardness of not greater than 3000 kgf/mm$^2$ with a greater internal compression stress. This may result in film separation, wrinkling and lifting.

Since the ornamental article of the present invention includes the thin hard carbon film 2 containing the fine crystals, a difference between PV levels of the surface roughness before and after the formation of the hard carbon film 2 is not greater than 40 nm. The PV level is herein defined as a distance between two lines which extend parallel to an average line of a surface section profile of a given length L obtained by means of a surface roughness tester as holding the surface section profile therebetween (i.e., a level difference between the highest and lowest levels of the surface section profile). That is, a difference between the PV level of the surface of the base 1 and the PV level of the surface of the hard carbon film 2 of the ornamental article is very small, i.e., not greater than 40 nm. Therefore, the hard carbon film 2 has a small surface roughness, so that post-processing of the film can be simplified.

Next, a process for forming the intermediate layer 3 and the hard carbon film 2 on the base 1 will be explained.

The intermediate layer 2 and the hard carbon film 3 are formed by a plasma CVD method or a heated filament CVD method. Particularly preferable is an electron cyclotron resonance plasma CVD method (hereinafter referred to as "ECR plasma CVD method"). In accordance with the ECR plasma CVD method, a magnetic field is applied to a plasma generating region in the plasma CVD method. A high density plasma can be uniformly generated in an extensive space under a reduced gas pressure (e.g., not higher than 1 torr). As a result, a uniform film having an area about ten times greater than that obtained by the ordinary plasma CVD method can be formed.

The ECR plasma CVD method to be employed for the production of the ornamental article of the present invention will hereinafter be described in detail.

While a reaction gas is introduced into a reactor in which a base having a predetermined configuration is placed, a 2.45-GHz microwave is introduced to the reactor with a magnetic field of not less than 875 gauss applied thereto. At this time, electrons go into a cyclotron motion at an electron cyclotron frequency of $f=eB/2\pi m$ (m: the mass of an electron, e: the electric charge of the electron, B: magnetic flux density). When this frequency is equated with the frequency (2.45 GHz) of the microwave, resonance occurs and the electrons remarkably absorb the energy of the microwave thereby to be accelerated. The electrons collide with neutral molecules to ionize the molecules. As a result, a high density plasma is generated. At this time, the temperature of the base is 150 to 100° C., and the pressure inside the reactor is $1 \times 10^{-2}$ to 1 torr.

In accordance with this method, the composition of the hard carbon film 2 is varied by changing the base temperature, the reactor internal pressure and the concentration of the reaction gas during the formation of the film. More specifically, if the reactor internal pressure is increased, the plasma region and the growth rate of the film are reduced, but the crystallinity of the film is increased. If the reaction gas concentration is increased, grains which constitute the resulting film have smaller diameters, and crystallinity is lowered. The hard carbon film 2 which satisfies the requirement of the peak intensities $H_1$, $H_2$ and $H_3$ in the Raman spectrum can be formed by properly controlling these conditions.

Hydrogen gas and a carbon-containing gas are used as the reaction gas (source gases). Examples of the carbon-containing gas include alkanes such as methane, ethane and propane, alkenes such as ethylene and propylene, alkynes such as acetylene, aromatic hydrocarbons such as benzene, cycloparaffins such as cyclopropane, and cycloolefins such as cyclopentene. Oxygen-containing carbon compounds such as carbon monoxide, carbon dioxide, methyl alcohol, ethyl alcohol and acetone, and nitrogen-containing carbon compounds such as monomethylamine, dimethylamine, trimethylamine, monoethylamine, diethylamine and triethylamine may be used as the carbon source gas. These gases are used either alone or in combination.

For production of the ornamental article of the present invention, the intermediate layer 3 containing the transition metal carbide is first formed on the surface of the base 1 by using at least hydrogen gas and the carbon-containing gas through the ECR plasma CVD method. The hard carbon film 2 is formed on the resulting intermediate layer 3 by using hydrogen gas and the carbon-containing gas through the ECR plasma CVD method.

In accordance with a preferred embodiment of the present invention, the intermediate layer 3 is formed through the ECR plasma CVD method by first performing a diamond nucleation process (in which only fine diamond crystals are allowed to grow to scatter on the base) and then introducing hydrogen gas, the carbon-containing gas and a silicon-containing gas as the reaction gas.

More specifically, by performing the diamond nucleation process, the first layer composed of a composite material containing diamond nuclei and the carbide of the same transition metal as that contained in the base 1 is formed on the base 1. Further, the second layer composed of diamond and silicon carbide is formed on the first layer in the same manner as described above by using hydrogen gas, the carbon-containing gas and the silicon-containing gas. The intermediate layer may be composed of a composite material containing the metal carbide and silicon carbide.

Examples of the silicon-containing gas include halides of silicon such as silicon tetrafluoride, silicon tetrachloride and silicon tetrabromide, oxides of silicon such as silicon dioxide, silane compounds such as monosilane, disilane, trisilane, tetrasilane, pentasilane, monomethylsilane, dimethylsilane, trimethylsilane and tetramethylsilane, and silanol compounds including silanols such as trimethylsilanol. These may be used either alone or in combination.

Figure 5:
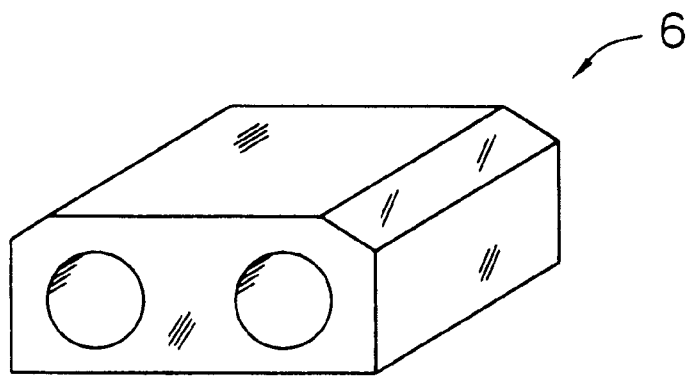
FIG. 5 is a perspective view illustrating a watchband piece which is a specific example of the ornamental article according to the invention.
Figure 6:
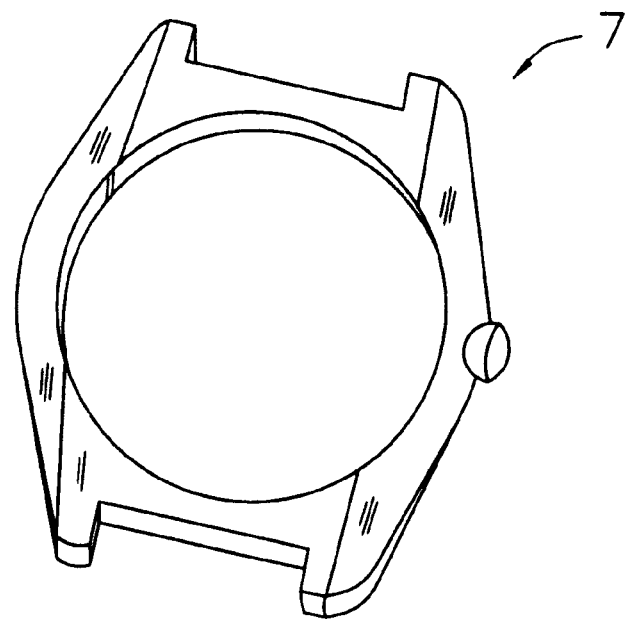
FIG. 6 is a perspective view illustrating a watch case which is another specific example of the ornamental article according to the invention.

In accordance with the process for producing ornamental articles mentioned above, the smooth and tight film can be formed on a surface of any of various bases having complicated configurations, curved configurations and any other configurations, such as a watchband piece 6 and a watch case 7 as shown in FIGS. 5 and 6, respectively.

The formation of the hard carbon film 2 and/or the intermediate layer 3 may be achieved by a thin film formation method such as an ordinary thermal CVD method or an ordinary plasma CVD method. The hard carbon film formed in this manner is typically comprised of a high purity diamond film, and has a structure with $SP^3$-hybridized carbon atoms. Accordingly, the hard carbon film has a peak only at $1340 \pm 40$ cm$^{-1}$ in the Raman spectrum. The hard carbon film locally includes graphitic carbon with $SP^2$-hybridized carbon atoms, and has a broad peak at 1500 to 1600 cm$^{-1}$ in the Raman spectrum.

Another embodiment of the present invention will next be described with reference to FIG. 4.

Figure 4:
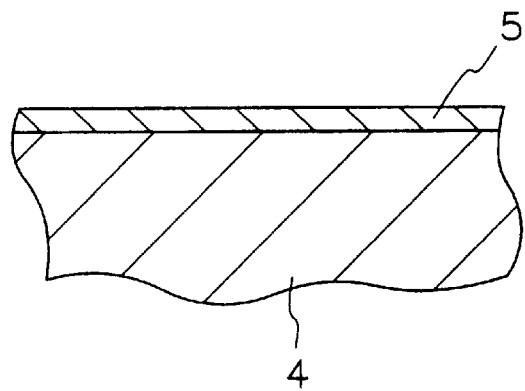
FIG. 4 is an enlarged sectional view illustrating part of an ornamental article according to another embodiment of the present invention.

An ornamental article shown in FIG. 4 includes a sintered base 4 with at least a surface portion thereof composed of a sintered material, and a 0.15–2 μm thick hard carbon film 5 covering the base 4, the hard carbon film 5 having a density of not less than 3.1 g/cm$^3$ and peaks in wavelength ranges of $1500 \pm 60$ cm$^{-1}$, $1160 \pm 40$ cm$^{-1}$ and $1340 \pm 40$ cm$^{-1}$ as determined by the Raman spectroscopy.

Examples of the sintered material include sintered alloys and ceramics. Specific examples of the sintered alloys include superhard alloys, TiC-cermets, TiCN-cermets and TiN-cermets which contain a binder phase component of an iron group metal such as Ni, Co or Fe in a proportion of about 1 to 20 wt % and a hard phase component of WC, TiCN, TiN, TiC or the like. Specific examples of the ceramics include alumina and zirconia. Other exemplary materials for the base include alloys containing gold, silver and copper. Further, the base may be plated with Ni to form an underlying layer and further plated with a precious metal.

The formation of the hard carbon film 5 on the base 4 maybe achieved by the thermal CVD method, the microwave CVD method, the ECR plasma CVD method or the like, but the ECR plasma CVD is particularly preferred.

The resulting hard carbon film 5 has peaks with intensities $H_1$, $H_2$ and $H_3$ in wavelength ranges of $1160\pm40$ cm$^{-1}$, $1340\pm40$ cm$^{-1}$ and $1500\pm60$ cm$^{-1}$ as determined by the Raman spectroscopy, as in the aforesaid embodiment. It is preferred that the peak intensities $H_1$, $H_2$ and $H_3$ satisfy the expressions (1) and (2) described above.

As previously mentioned, the hard carbon film 5 is a tight film having a density of not less than 3.1 g/cm$^3$, and diamond crystals contained in the hard carbon film 5 are very fine. The fine diamond crystals have an average grain diameter of not greater than 1 μm, preferably not greater than 80 nm.

In the ornamental article shown in FIG. 4, the hard carbon film 5 is directly provided on the base 4 composed of the sintered component, but an intermediate layer may be interposed therebetween. In this case, the total thickness of the intermediate layer and the hard carbon film 5 should be within the range from 0.15 to 2 μm as described above.

Since the surface portion of the base 4 is composed of the sintered material, it is preferred for enhancement of the adhesion of the hard carbon film 5 that the intermediate layer is composed of a composite material essentially containing diamond and at least one metal carbide selected from silicon carbide and boron carbide. Silicon carbide and boron carbide, particularly silicon carbide, have covalent bonds, so that the compatibility of the intermediate layer with diamond constituent carbon is improved. Therefore, the enhancement of the adhesion is supposedly attributable to a so-called anchoring effect.

EXAMPLES

There will next be explained examples of the present invention.

Example 1

A base of Ti and an Ti alloy (Ti-6Al-4V) was place in a reactor of an ECR plasma CVD apparatus.

Subsequently, $H_2$ gas and $CH_4$ gas were introduced into the reactor at rates of 294 sccm and 6 sccm, respectively, and the base was processed in the reactor for one hour under the conditions of a gas concentration of 2%, a base temperature of 650° C. and a reactor internal pressure of 0.1 torr. Thus, a first layer of a composite material containing TiC (carbide of titanium which is a constituent metal component of the base) and diamond nuclei (hard carbon) was formed on the base.

Next, $H_2$ gas, $CH_4$ gas and $Si(CH_3)_4$ gas were introduced as source gases into the reactor at rates of 294 sccm, 6 sccm and 0.3 sccm, respectively, and the resulting first layer was subjected for 3 hours to an ECR plasma CVD process for filming under the conditions of a gas concentration of 2%, a base temperature of 650° C., a reactor internal pressure of 0.05 torr, and a microwave output of 3.0 Kw with a magnetic field of a maximum magnetic flux density of 2 Kgauss being applied to the reactor. Thus, a second layer of a composite material containing diamond and silicon carbide (SiC) was formed on the first layer. The first and second layers served as an intermediate layer. That is, TiC, diamond and SiC coexist in the intermediate layer. The thickness of the intermediate layer was adjusted so as to be about one third the thickness of a hard carbon film which was later formed on the intermediate layer.

Sample Nos. 1, 2 and 4 to 6 shown in Table 1 each had an intermediate layer formed in the aforesaid manner. Sample No. 3 in Table 1 had an intermediate layer which was formed in substantially the same manner as the other samples, except that the second layer of the intermediate layer was formed of silicon carbide by employing source gases of $H_2$ and $Si(CH_3)_4$ introduced at rates of 300 sccm and 0.3 sccm, respectively.

In turn, a hard carbon film was formed on the surface of the intermediate layer under the conditions of a gas ratio, a gas concentration, a filming temperature and a reactor internal pressure as shown in Table 1 by using not lower than 99.9% pure $H_2$ gas, $CH_4$ gas and $CO_2$ gas. The total thickness of the intermediate layer and the hard carbon film was 0.1 to 5 μm.

As a comparative example, Sample No. 7 was prepared which did not include a hard carbon film but was comprised of a Ti alloy (Ti-6Al-4V) base alone.

TABLE 1

| Sample | | | Hard carbon film | | | | | | |
| | | | Reaction gas (SCCM) | | | Gas Conc. | Filming Temp. | Reactor Pres. | Total Thick. |
| No. | Base | Intermediate layer | $H_2$ | $CH_4$ | $CO_2$ | (%) | (° C.) | (torr) | (μm) |
| 1 | Ti alloy | D + SiC + TiC | 240 | 20 | 40 | 20 | 800 | 0.1 | 1.0 |
| 2 | Ti alloy | D + SiC + TiC | 240 | 20 | 40 | 20 | 650 | 0.1 | 1.0 |
| 3 | Ti alloy | D + SiC + TiC | 240 | 30 | 30 | 20 | 550 | 0.1 | 1.0 |
| 4 | Ti alloy | D + SiC + TiC | 210 | 30 | 60 | 30 | 550 | 0.01 | 1.0 |
| 5 | Ti alloy | D + SiC + TiC | 210 | 30 | 60 | 30 | 650 | 0.01 | 1.0 |
| 6 | Ti alloy | D + SiC + TiC | 210 | 60 | 30 | 30 | 650 | 0.01 | 1.0 |
| *7 | Ti alloy | No hard carbon film | — | — | — | — | — | — | — |

Note)
"D" for the intermediate layer means hard carbon.
Sample prefixed with * is comparative example.

The samples were each subjected to the Raman spectroscopy for analysis of the surface of the hard carbon film ×: Separation occurred with a load of less than 1 kgf/cm$^2$ The results are shown in Table 2.

TABLE 2

| Sample No. | $H_1/H_2$ | Relation of peaks $H_1, H_2, H_3$ | Corrosion test | Metal leachout amount (ppm) | Density (g/cm$^3$) | Erosion resistance | Adhesion strength |
|---|---|---|---|---|---|---|---|
| 1 | 0.02 | $H_1 < H_2 < H_3$ | No change | <0.1 | 3.4 | Excellent | ◎ |
| 2 | 0.3 | $H_1 < H_2 < H_3$ | No change | <0.1 | 3.4 | Excellent | ◎ |
| 3 | 0.4 | $H_1 < H_2 < H_3$ | No change | <0.1 | 3.4 | Excellent | ◎ |
| 4 | 0.6 | $H_1 < H_2 < H_3$ | No change | <0.1 | 3.3 | Excellent | ◎ |
| 5 | 1.1 | $H_1 < H_2 < H_3$ | No change | <0.1 | 3.2 | Excellent | ◎ |
| 6 | 1.6 | $H_1 < H_2 < H_3$ | No change | <0.1 | 3.1 | Excellent | ◎ |
| *7 | — | — | Entire corrosion | 2000 | — | Bad | — |

Figure 2:
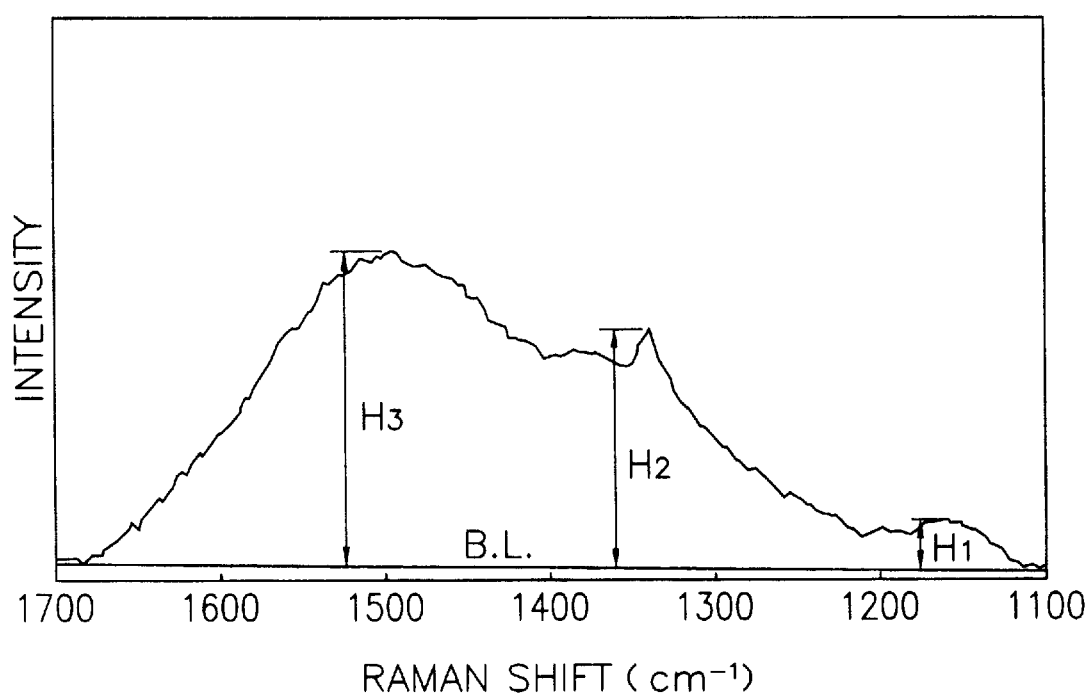
FIG. 2 shows a Raman spectrum chart for a hard carbon film of Sample No. 2 of an example.

Note)
Sample prefixed with * is comparative example.

thereof. For each of the samples, a peak intensity ratio $H_1/H_2$ was determined wherein $H_1$ and $H_2$ are intensities of the highest peaks in wavelength ranges of 1160±40 cm$^{-1}$ and 1340±40 cm$^{-1}$, respectively, which are the heights of the peaks as measured from a base line (B.L.) extending between points at 1100 cm$^{-1}$ and 1700 cm$^{-1}$ in the obtained Raman spectrum chart. Further, an intensity of the highest peak present at 1500±60 cm$^{-1}$ was obtained for comparison among the peak intensities $H_1$, $H_2$ and $H_3$. The results are shown in Table 2. Spectrum chart for Sample No. 2 in Table 1 is shown in FIG. 2. It is noted that Ar laser (488.0 nm) was employed as the radiation source of a Raman spectrophotometer.

The samples were each immersed in an aqua regia solution for a given period. The surfaces of the resulting samples were each observed by means of a microscope for checking the corrosion thereof.

The amount of leached metal Ti was measured by the ICP method. The hard carbon film was separated from each of the samples, and the density thereof was determined by the sink-float method using a thallium formate solution as a specific gravity solution.

Further, the hard carbon film was subjected to a sand-blasting process for determination of erosion resistance.

In order to evaluating the adhesion strength of the hard carbon film, film-separation starting load of the hard carbon film is measured by using a scratch tester. The scratch tester is provided with a cartridge and a penetrator provided on a lever extended from the top of the cartridge, and the penetrator is pressed on the hard carbon film formed on the base which is upwardly inclined at gradient of 5° to a vertical direction. Under this condition, the cartridge was horizontally moved along the vertical direction with swinging to the lateral direction to load the hard carbon film, and the film-separation starting load was measured. The top of the penetrator has a radius of curvature of 25 μm, a moving rate of the base to the vertical direction was 10 μm/s, and a swinging width to the lateral direction was 80 μm.

On the basis of the measured film-separation starting load, the adhesion strength of the hard carbon film was rated in accordance with the following criteria.

◎: Separation did not occur with a load of not less than 50 kgf/cm$^2$

○: Separation occurred with a load of not less than 10 kgf/cm$^2$ and less than 50 kgf/cm$^2$ △: Separation occurred with a load of not less than 1 kgf/cm$^2$ and less than 10 kgf/cm$^2$ As apparent from Table 2, the samples each formed with a hard carbon film having a $H_1/H_2$ ratio of not less than 0.02 and satisfying a peak intensity relation $H_1<H_2<H_3$ each exhibited an excellent corrosion resistance with a small metal leach-out amount with respect to the strong acidic solution. Further, these samples each had a high density of not less than 3.1 g/cm$^3$, and exhibited an excellent erosion resistance with a smaller abrasion level.

On the other hand, Sample No. 7 not formed with a hard carbon film exhibited a deteriorated corrosion resistance.

Further, crystal grains in each of the hard carbon films of the samples were observed by means of a transmission electron microscope. As a result, very small diamond crystals with gain sizes of about 40nm were observed in Sample Nos. 1 to 6. Sample Nos. 1 to 6 each exhibited a superior erosion resistance. This is supposedly because the hard carbon films had an excellent impact resistance due to the smaller sizes of the crystal grains.

In Sample No. 2, the surface roughness PV before the formation of the hard carbon film was 27 nm, while the surface roughness PV after the formation of the hard carbon film was 57 nm. Thus, the PV difference was small, so that the post-processing of the film was easy. In Sample Nos. 1 and 3 to 6, differences between the PV levels obtained before and after the formation of the hard carbon films were not greater than 40 nm, so that the post-processing of the film was easy.

Although the bases were composed of a Ti alloy and the intermediate layers were composed of a TiC-containing material in this example, a sample including a base composed of a metal material containing as a principal component any of Group 4a, 5a and 6a transition metals such as V, Cr, Zr, Nb, Mo, Hf, Ta and W and an intermediate layer composed of a material containing a carbide of the transition metal provided substantially the same results.

Example 2

A base composed of a superhard alloy (80 wt % WC-10 wt % Co-10 wt % Ni) , a TiC-cermet (80wt % TiC-15wt % $Cr_2C_2$-5 wt % Ni) or a TiN-cermet (85wt % TiN-15 wt % Ni) was placed in a reactor of an ECR plasma CVD apparatus.

Subsequently, $H_2$ gas and $CH_4$ gas were introduced into the reactor at rates of 97 sccm and 3 sccm, respectively, and a plasma process was performed for 1.5 hours under the conditions of a gas concentration of 1% , a base temperature of 650° C. and a reactor internal pressure of 0.1 torr for generation of diamond nuclei. Next, $H_2$ gas, $CH_4$ gas and $Si(CH_3)_4$ gas were introduced into the reactor at rates of 297 sccm, 3 sccm and 0.3 sccm, respectively, and an ECR plasma CVD process was performed for 12 hours for filming under the conditions of a gas concentration of 1%, a base temperature of 650° C., a reactor internal pressure of 0.5 torr, and a microwave output of 3.0 Kw with a magnetic field of a maximum magnetic flux density of 2 Kgauss being applied to the reactor. Thus, an intermediate layer having an average thickness of 0.5 μm and composed of a composite material of diamond and silicon carbide was formed on the base.

In turn, not lower than 99.9% pure $H_2$ gas, $CH_4$ gas and $CO_2$ gas were introduced into the reactor at flow rates of 210 sccm, 30 sccm and 60 sccm, respectively, and an ECR plasma CVD process was performed in substantially the same manner under the conditions of a gas concentration of 30%, a base temperature of 650° C. and a reactor internal pressure of 0.1 torr or 0.01 torr. Thus, a 0.5-μm thick hard carbon film was formed on the intermediate layer.

The hard carbon film and the intermediate layer (total thickness: 1 μm) was analyzed by the Raman spectroscopy. The result was substantially the same as that shown in FIG. 2. As can be seen from FIG. 2, peaks were observed in wavelength ranges of $1500\pm60$ cm$^{-1}$, $1160\pm40$ cm$^{-1}$ and $1340\pm40$ cm$^{-1}$.

Further, the density of the hard carbon film was determined by the sink-float method using a thallium formate solution. As a result, the hard carbon film formed at a reactor internal pressure of 0.1 torr had a density of 3.3 g/cm$^3$, and the hard carbon film formed at a reactor internal pressure of 0.01 torr had a density of 3.2 g/cm$^3$.

Sample Nos. 8 to 16 were each prepared in the aforesaid manner so that the total thickness of the hard carbon film and the intermediate layer was adjusted as shown in Table 3. The respective samples were evaluated for the hue and the film compression strength.

The hue was rated on the basis of the following criteria.

◎: Excellent color condition with an iridescent hue
○: Good color condition with a substantial iridescent hue
Δ: Color condition with almost no light interference
×: Bad color condition virtually exhibiting black The adhesion strength was evaluated in the same manner as in Example 1.

The results are shown in Table 3.

TABLE 3

| Sample No. | Thickness of carbon film (μm) | Hue | Adhesion strength |
|---|---|---|---|
| *8 | 0.13 | ◎ | ◎ |
| 9 | 0.18 | ◎ | ◎ |
| 10 | 0.3 | ◎ | ◎ |
| 11 | 0.5 | ◎ | ◎ |
| 12 | 1.0 | ◎ | ◎ |
| 13 | 2.0 | ○ | ○ |
| *14 | 3.0 | Δ | Δ |
| *15 | 4.0 | Δ | Δ |
| *16 | 5.0 | × | × |

Note:
Samples prefixed with * are Comparative examples.

As apparent from Table 3, Sample Nos. 9 to 13 each had an excellent hue and adhesion strength of the hard carbon film. Sample No. 8 had an excellent hue and adhesion strength, but its carbon film was not tight because of its very small thickness.

The hard carbon film of each of the samples had peaks in the wavelength ranges of $1160\pm40$ cm$^{-1}$, $1340\pm40$ cm$^{-1}$ and $1500\pm60$ cm$^{-1}$ with peak intensities $H_1$, $H_2$ and $H_3$, respectively, as shown in FIG. 2. The peak intensity ratio $H_1/H_2$ was not less than 0.02 as expressed in the aforesaid expression (1), and the peak intensity relation $H_1<H_2<H_3$ was satisfied.

Although the present invention has been described in relation to particular embodiments thereof, many other variations and modifications and other uses will become apparent to those skilled in the art. Therefore, the present invention is to be limited not by the specific disclosure herein, but only by the appended claims.

What is claimed is:

1. An ornamental article comprising:
   a base at least a surface of which comprises at least one transition metal selected from the group consisting of titanium, vanadium, chromium, zirconium, niobium, molybdenum, hafnium, tantalum and tunosten or an alloy containing the transition metal as its principal component;
   an intermediate layer containing a carbide of the transition metal covering the surface of the base; and
   a hard carbon film of between 0.1 and 10 μm thick covering the intermediate layer, the hard carbon film comprising a mixture of diamond precursors, measured as $H_1$, a Raman spectroscope peak in a wavelength range of $1160\pm40$ cm$^{-1}$, diamond crystals, measured as $H_2$, a Raman spectroscope peak in a wavelength range of $1340\pm40$ cm$^{-1}$, and amorphous carbon, measured as $H_3$, a Raman spectroscope peak in a wavelength range of $1500\pm60$ cm$^{-1}$, wherein Raman spectroscopic analysis of the hard carbon film satisfies the relationships of that $0.02 \leq H_1/H_2$ and $H_2<H_3$ where $H_1$, $H_2$, and $H_3$ are peak heights measured from a base line extending between point of lowest intensity.

2. An ornamental article as set forth in claim 1, wherein the intermediate layer comprises a composite material containing the carbide of the transition metal and at least one selected from silicon carbide and hard carbon.

3. An ornamental article as set forth in claim 2, wherein the intermediate layer comprises a first layer comprising a composite material containing the carbide of the transition metal and hard carbon; and a second layer comprising a composite material containing silicon carbide and hard carbon; the first and second layers being provided on the surface of the base in this order.

4. An ornamental article as set forth in claim 1, wherein the hard carbon film comprises crystal grains having an average grain diameter of not greater than 80 nm.

5. An ornamental article as set forth in claim 1, wherein the hard carbon film has a density of not less than 3.1 g/cm$^3$.

6. An ornamental article as set forth in claim 1, wherein the hard carbon film and the intermediate layer have a total thickness of 0.15 to 2 μm.

7. An ornamental article comprising a base and a hard carbon film covering a surface of the base, wherein the hard carbon film has peaks in wavelength ranges of $1500\pm60$ cm$^{-1}$, $1160\pm40$ cm$^{-1}$ and $1340\pm40$ cm$^{-1}$ as determined by Raman spectroscopy, and has a density of not less than 3.1 g/cm$^3$ and a thickness of 0.15 to 2 μm.

8. An ornamental article as set forth in claim 7, wherein an intermediate layer is interposed between the base and the hard carbon film, the intermediate layer containing hard carbon and a metal carbide selected from silicon carbide and boron carbide.

9. An ornamental article as set forth in claim 7, wherein at least a surface portion of the base comprises a sintered material selected from a sintered alloy and a ceramic.

* * * * *